United States Patent [19]

Behrens et al.

[11] Patent Number: 5,329,554
[45] Date of Patent: Jul. 12, 1994

[54] DIGITAL PULSE DETECTOR

[75] Inventors: Richard T. Behrens, Louisville; Trent Dudley, Littleton; Neal Glover, Broomfield, all of Colo.

[73] Assignee: Cirrus Logic, Inc., Fremont, Calif.

[21] Appl. No.: 879,938

[22] Filed: May 8, 1992

[51] Int. Cl.⁵ .............................. H04L 27/06
[52] U.S. Cl. ............................ 375/94; 375/76; 328/151
[58] Field of Search .................. 375/10, 76, 94; 328/114–120; 307/360–363; 329/312

[56] References Cited

U.S. PATENT DOCUMENTS

| | | | |
|---|---|---|---|
| 4,566,044 | 1/1986 | Langdon, Jr. et al. | 360/40 |
| 4,628,269 | 12/1986 | Hunninghaus et al. | 328/120 |
| 4,788,507 | 11/1988 | Berkowitz et al. | 328/114 |
| 5,105,447 | 4/1992 | Iwane | 375/94 |

OTHER PUBLICATIONS

W. L. Abbott, J. M. Cioffi and H. K. Thapar, "Channel Equalization Methods for Magnetic Storage", presented at the International Conference on Communications, 1989.

Primary Examiner—Stephen Chin
Assistant Examiner—Young Tse
Attorney, Agent, or Firm—James R. Young

[57] ABSTRACT

Disclosed is a pulse detector that uses four samples of an analog signal to detect a pulse as soon as one sample beyond the time of the peak of the signal level at the pulse. The pulse detector can detect pulses by sampling at the center of a peak of the pulse or by sampling at either side of the peak of the pulse. The pulse detector detects pulses while tracking data, and it uses an alternate detection system for detecting pulses while acquiring timing and gain lock on a signal having a known data pattern. The detector uses either the sampled signal levels directly, or a moving average of two samples to perform the detection.

21 Claims, 10 Drawing Sheets

DIGITAL PULSE DETECTOR

CROSS REFERENCE TO RELATED APPLICATIONS

This application is related to application Ser. No. 07/852,015, filed Mar. 16, 1992, of Richard T. Behrens, Kent D. Anderson and Neal Glover, entitled "Method and Apparatus for Reduced-Complexity Viterbi-Type Sequence Detectors", which is owned by the same entity.

FIELD OF THE INVENTION

This invention relates to computer systems and more particularly to data storage and data communication devices within such computer systems. Even more particularly, the invention relates to apparatus for detecting pulses resulting from bit transitions within a data stream being read from a recording medium of a data storage device or pulses in data being received from a data communication device.

BACKGROUND OF THE INVENTION

In a computer data storage device, data is typically stored on magnetic media by reversing the magnetic flux at each "one" bit location, and maintaining the same flux direction at each "zero" bit location, called NRZI recording. When these flux reversals pass a read head they cause a voltage change in the read head. The voltage from the various flux reversals along a data track appears as a varying signal level on the output of the read head, with the voltage caused by each flux reversal appearing as a positive or negative voltage pulse. These pulses must be detected by the electronics connected to the read head, typically by detecting the peak of each pulse to determine the pulse location.

Similarly, the voltage from a data transmission line appears as a varying signal level on the input to a data communication device, such as a modem, with the voltage of each bit change often appearing as a positive or negative voltage pulse.

In order to separate the voltage pulses from noise in the signal, the voltage may be compared to a predetermined threshold, and only peaks whose magnitude exceeds the threshold are considered to be possible pulses. If the peaks are too small with respect to the threshold, the signal gain must be adjusted higher, and if the peaks are too high the gain must be adjusted lower. To properly determine the gain setting, pulses must be detected so that the gain adjustment can maintain the proper level for a pulse peak.

Because the rotational speed of a disk may vary, a phase locked loop is used to synchronize a detector to the times of the pulses. The peaks of the pulses caused by bit transitions must be detected in order to correct for any timing deviations.

Several methods have been used to detect the pulses and thus the transitions within the data. In the prior art, peak detection circuitry has ordinarily been analog in nature, while digital detectors have ordinarily been sequence detectors such as those implementing the Viterbi method, disclosed in application Ser. No. 07/852,015, filed Mar. 16, 1992, of Richard T. Behrens, Kent D. Anderson and Neal Glover, entitled "Method and Apparatus for Reduced-Complexity Viterbi-Type Sequence Detectors", which is incorporated herein by reference for all that is disclosed and taught therein. However, most digital pulse detectors analyze the context of the pulses, and do not detect a pulse until several samples have been taken beyond the peak of the pulse. This latency in detecting pulses is a disadvantage when the location of a pulse needs to be known in order to make timing and/or gain corrections.

It is thus apparent that there is a need in the art for an improved apparatus which digitally detects pulses at the earliest possible time after the peak of the pulse occurs. The present invention meets these and other needs.

SUMMARY OF THE INVENTION

It is an aspect of the present invention to detect signal pulses caused by bit transitions within data being read from a data storage device.

It is another aspect of the invention to detect signal pulses within signals received by a data communications device.

It is another aspect of the invention to detect the pulses using samples of the signal wherein one of the samples occurs at a peak of the pulse caused by a bit transition.

Another aspect of the invention is to detect such pulses using samples of the signal wherein samples occur on each side of a peak of the pulse and wherein no sample occurs at the peak.

A further aspect is to detect a pulse within one half to one and one half sample periods from the peak of the pulse.

A still further aspect is to use signal level moving averages of two samples for detection.

The above and other aspects of the invention are accomplished in a digital pulse detector that uses four samples of a read signal to detect a data transition as soon as one sample beyond the time of the peak of the signal level at the bit transition. The pulse detector detects peaks by sampling at the center of the peak or by sampling at each side of the peak. The pulse detector detects pulses while tracking, where the pattern of pulses is not known in advance, or while acquiring timing lock on the signal in a preamble, where the data pattern is fixed. Thus the pulse detector provides four combinations of detection to detect in tracking or acquisition mode, using either center or side sampling in either mode. The detection rules are summarized in Table 2.

In an alternative embodiment, the detector uses a moving average of two adjacent samples, as well as individual sample signal levels, to perform the detection. The alternative embodiment uses the sampled signal levels directly to determine peaks in side sampled acquisition mode, and in center sampled tracking mode. In the other two of the combinations, the alternative embodiment detector uses two-sample moving averages to determine peaks. The preamble pattern for acquisition in the alternative embodiment is restricted to be a repeating sequence of alternating polarity pulses with a period of four sample intervals. This is more restrictive than the pattern handling capability of the first embodiment, however, it permits the alternative embodiment to perform earlier detection of the pulses in the side sampled acquisition case and it uses simpler rules in acquisition. The detection rules for the alternative embodiment are summarized in Table 1.

Both embodiments avoid using a signal threshold to qualify the pulses during acquisition. This aspect prevents the gain at the beginning of the acquisition from affecting acquisition, since the gain may be incorrect at the beginning of acquisition. During tracking, where the pulses may be more widely separated, a threshold is used to qualify pulses. This qualification prevents the detection of small noise-induced pulses as data pulses.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
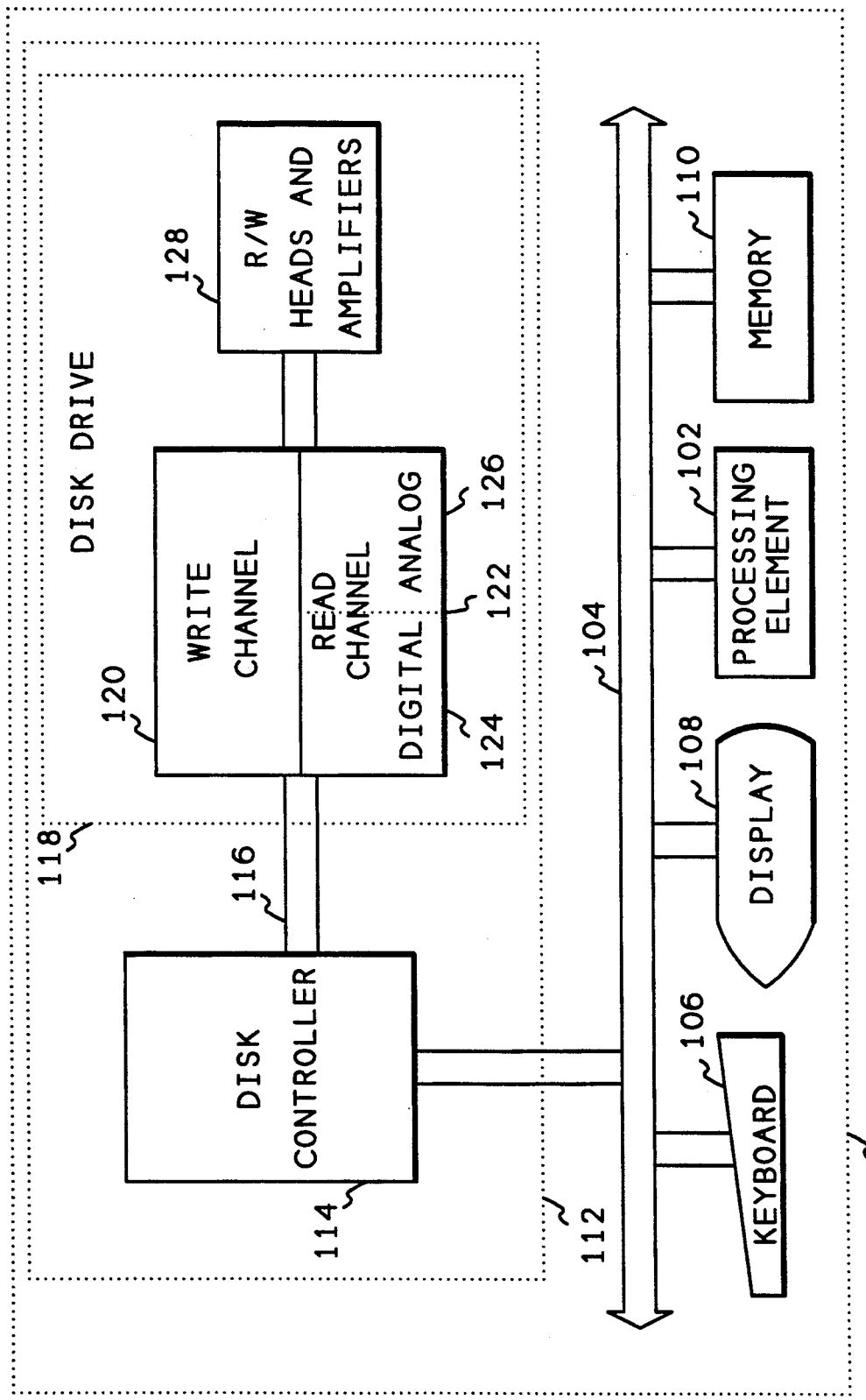
FIG. 1 shows a block diagram of the invention and the environment of the invention.

FIG. 1 shows a block diagram of the invention and a typical environment of the invention. Referring now to FIG. 1, a computer system 100 contains a processing element 102 which communicates to other elements of the computer system 100 over a system bus 104. A keyboard 106 and a display 108 allow a user of the computer system 100 to communicate with the computer system 100. A memory 110 contains programs and data which cause the computer system 100 to perform operations desired by the user.

A disk data storage system 112 is connected to the system bus 104 for storing data and programs within the computer system 100. A disk controller 114 within the disk device 112 communicates to the system bus 104 and controls the operations of a disk drive 118, possibly in conjunction with a local microprocessor (not shown) within the disk data storage system 112. The disk drive 118 performs the storage function, typically storing the data on magnetic media. A bus 116 connects the disk controller 114 to the disk drive 118, specifically connecting to a write channel 120 to write data onto the disk through write heads and amplifiers 128. When data is being read from the disk through the read head and amplifiers 128 the data comes back through the read channel 122 which contains the pulse detector of the present invention. The read and write heads may be physically the same heads. The data first passes through the analog section 126 of the read channel 122 and then through the digital section 124 of the read channel 122 before being sent on the bus 116 to the disk controller 114. After being processed by the disk controller 114, the data is then sent over the system bus 104 to the memory 110 where it is processed.

The disk controller 114 also connects to other circuits, not shown, within the disk drive 118, such as a circuit which moves the read/write heads over the surface of the data storage media.

Although not shown in FIG. 1, the pulse detector of the present invention can be used to detect pulses within data received from a transmission line, such as a telephone line or local area network, in a data communications receiver. It may also be used in any other device that must detect pulses within a signal.

Figure 2:
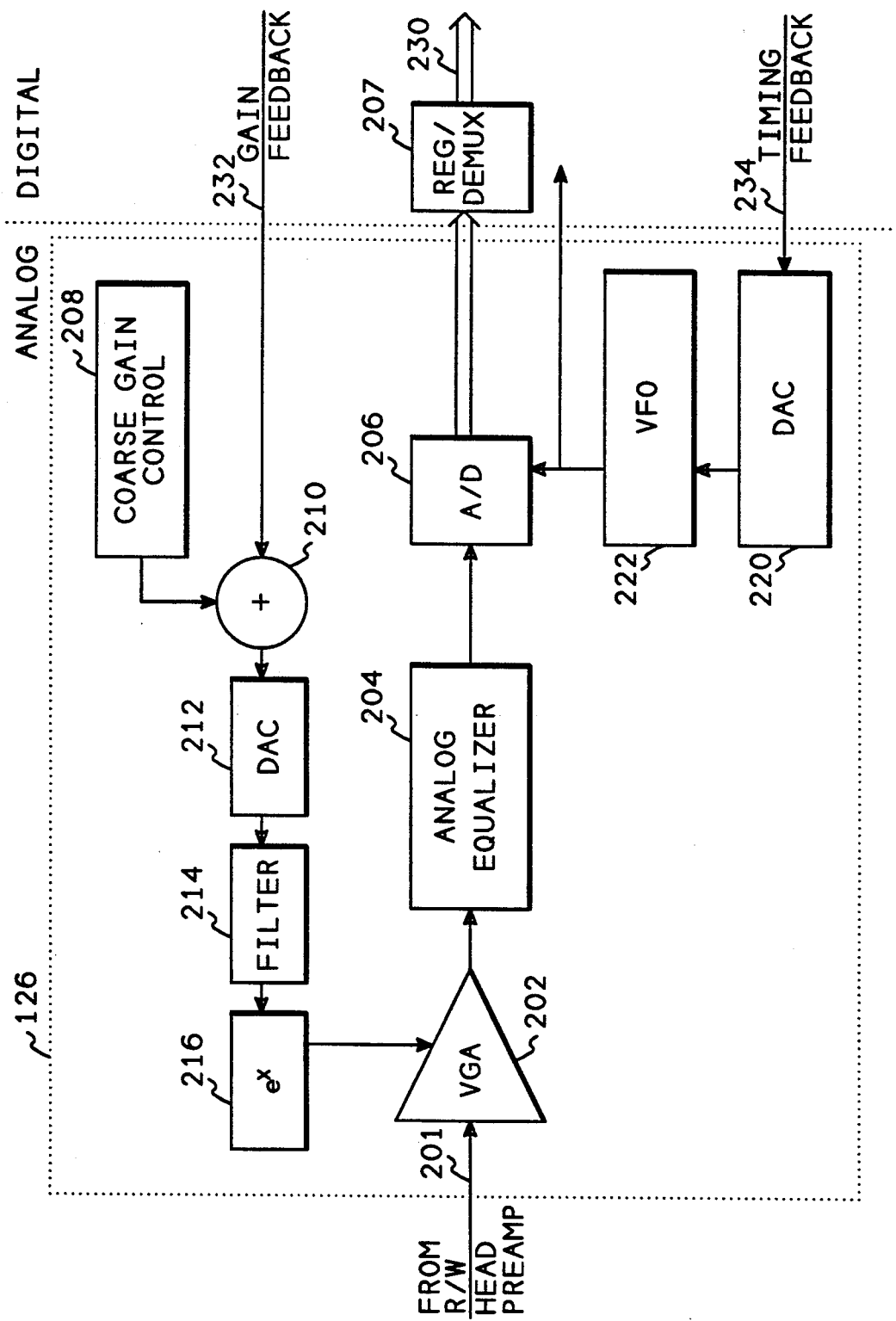
FIG. 2 shows a block diagram of the circuitry that provides data samples to the invention.

FIG. 2 shows a block diagram of the analog circuitry 126 of the read channel 122. Referring now to FIG. 2, when a read head is passing over a track of the data storage medium, it picks up a signal which is amplified by a preamplifier, not shown. After this preamplification, the signal 201 is passed to a variable gain amplifier 202. The signal is further amplified by the variable gain amplifier 202 and passed through an analog equalizer circuit 204, which filters the signal as desired, for example, so as to remove unwanted high frequencies and shape the remaining spectrum, to an Analog to Digital converter 206. The A to D converter 206 converts the analog signal into a digital value, providing six bits of digital information in the preferred embodiment, and then the data is passed to a register/de-multiplexer 207. In the preferred embodiment, the digital section 124 of the read channel 122 processes two samples in parallel. To create these two samples, the register/de-multiplexer 207 stores every other sample taken by the A to D converter 206. After the second sample is taken, the data from the two samples is passed to the data bus 230. The bus 230 is clocked by a single half-frequency clock signal.

The timing necessary for converting the data, also called taking a sample, in the A to D converter 206 is supplied by a variable frequency oscillator 222 which is controlled by the output of a digital to analog converter (DAC) 220. The input to the DAC 220 comes from the digital section of the read channel 124 as timing feedback signal 234.

The gain of the variable gain amplifier 202 is controlled through a gain feedback signal 232 which originates in the digital portion 124 of the read channel 122. The gain feedback signal 232 is input to a summing junction 210 which has a coarse gain control value as its other input. The coarse gain control can be set by the disk controller 114, or a local microprocessor within the disk drive (not shown), to provide a nominal gain level which is then adjusted up or down by the gain feedback signal 232. After being summed with the coarse gain control value, the feedback signal is sent to a digital to analog converter 212 and then to a filter 214. Because of the nature of digital to analog converters, the output of the DAC 212 may contain glitches when it is changing values. Therefore, the filter 214 may be necessary to remove these glitches in the feedback signal. After being filtered, the signal is converted to an exponential value by the exponential converter block 216 and then connected to the variable gain amplifier 202. This conversion makes the small-signal gain control dynamics independent of the input signal amplitude.

Figure 3:
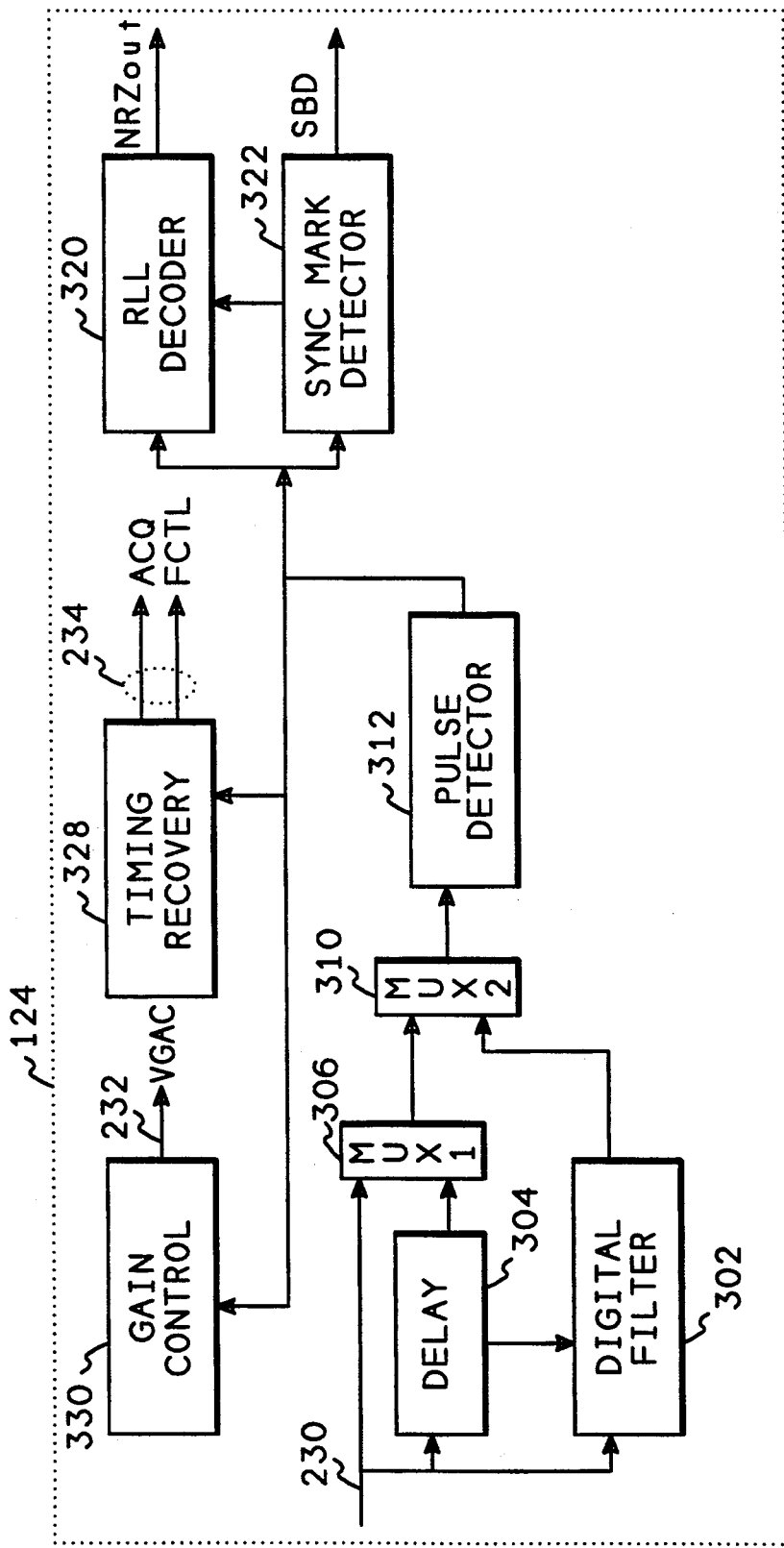
FIG. 3 shows a block diagram of the digital circuitry of the read channel containing the invention.

FIG. 3 shows a block diagram of the digital section 124 of the read channel 122 (FIG. 1). Referring now to FIG. 3, the digital data signal 230 from FIG. 2 is input to a delay circuit 304 and a digital filter circuit 302. The digital data signal 230 is also input to a multiplexer 306 whose output is connected to a second multiplexer 310 with an output that feeds the pulse detector 312 of the present invention. The output of the pulse detector 312 is connected to a gain control circuit 330 which provides the gain feedback signal 232 that connects to FIG. 2. The output of the pulse detector 312 is also connected to a timing recovery circuit 328 whose output 234 connects to the digital to analog converter 220 of FIG. 2. The output of the pulse detector 312 of the present invention may also be connected to a sync mark detector 322 and an RLL decoder 320, as shown in FIG. 3, or a more sophisticated data detector (not shown) may be connected to the sync mark detector 322 and the RLL decoder 320. The output of the RLL decoder 320 and the sync mark detector 322 are connected to the disk controller 114 (FIG. 1) through the bus 116.

The pulse detector 312 of the present invention is designed to detect pulses using one of two types of sampling methods, selected by the user. The first detection method is called center sampling wherein one of the samples taken will arrive at or very near the center, or peak, of a pulse. The location of the sampling is controlled by the timing recovery block 328 of FIG. 3. In the other method of sampling, called side sampling, the timing recovery block 328 will adjust the timing of the VFO 222 (FIG. 2) such that two samples are taken wherein one of the two samples appears on one side of the peak of the pulse and the other of the two samples appears on the other side of the peak. The user of the system determines whether center sampling or side sampling is used by setting a bit in a control register through the interface 116 (FIG. 1).

For either center or side sampling, sampling can occur at two different times within a data record being read from the disk media. The first time sampling occurs is called acquisition, because it occurs when the gain control and timing control are acquiring the gain and timing relationships of the pulses. This occurs when the read head is passing a preamble portion of the data record which always has a known data pattern to facilitate acquisition of the timing and gain. When data is being transferred, a different mode is used for the pulse detector, called tracking, since data has an irregular and a priori unknown pattern of pulses.

Therefore, the pulse detector of the present invention is designed to detect pulses under four separate conditions. The first condition is acquisition mode using side sampling, the second is acquisition mode using center sampling, third is tracking mode using side sampling, and fourth is tracking mode using center sampling.

The pulse detector analyzes the current sample of the amplitude of the signal as well as the previous three samples of the signal amplitude. Using these four samples, Table 1 shows equations for one embodiment of the pulse detector, and Table 2 shows equations for another embodiment.

In Table 1, $y_n$ is the current sample, $y_{n-1}$ is the first previous sample and $y_{n-2}$ is the second previous sample. The third previous sample is used only through the moving averages, $(1+D)/2$ (described below). The equations of Table 1 will be further described below with respect to FIGS. 5 and 6. Also, the equations of Table 1 show pulse detection of a pulse whose peak occurs at time $y_{n-1}$ for center sampling, or between $y_{n-1}$ and $y_{n-2}$ for side sampling tracking mode, or between $y_n$ and $y_{n-1}$ for side sampling acquisition mode. The circuits of FIGS. 6-8 processes two signal samples simultaneously. The equations for the second sample are the same as the equations of Table 1, with one time delay. Thus, for example, $y_n$ in Table 1 would be replaced by $y_{n-1}$, $y_{n-1}$ would be replaced by $y_{n-2}$, and $y_{n-2}$ would be replaced by $y_{n-3}$.

Figure 4:
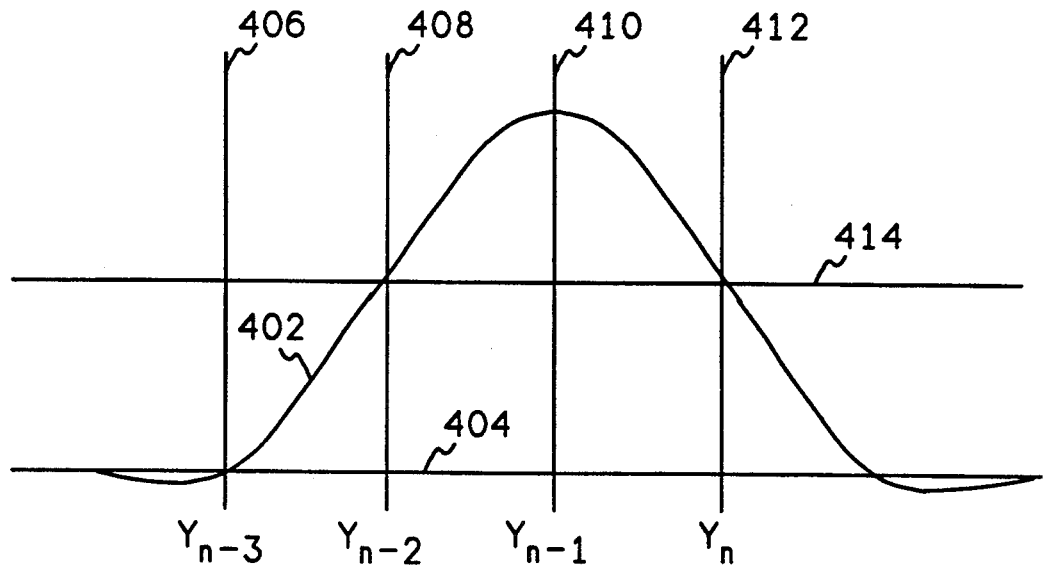
FIG. 4 shows a signal waveform and illustrates center sampling of the pulses.

FIG. 4 shows a signal waveform of an isolated pulse and illustrates center sampling of the pulse. Referring now to FIG. 4, a signal waveform 402 is shown having a positive level above a baseline 404. Four samples of this waveform have been taken with the sample identified by reference 412, $y_n$, being the most recent sample. Sample 410, $y_{n-1}$, is the sample just prior to the most recent sample, sample 408 is the next previous sample and sample 406 is the oldest of the four samples shown. A threshold value 414 is also shown and the signal value of sample 410 must be greater than the threshold 414 for the pulse to be detected in tracking mode. Negative pulses would appear as a mirror image of FIG. 4.

Figure 5:
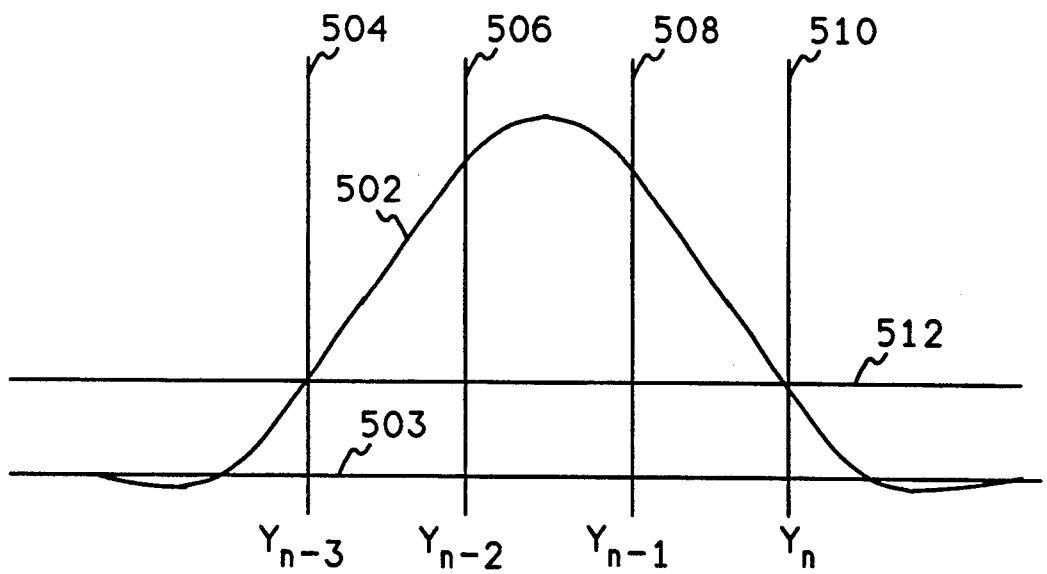
FIG. 5 shows a signal waveform and illustrates side sampling of the pulses.

FIG. 5 shows a signal waveform of an isolated pulse and illustrates side sampling of the pulse. Referring now to FIG. 5, a signal waveform 502 is shown as a positive level above a baseline 503. Four samples are shown, with the most recent sample being sample 510. Sample 508 is the sample previous to the most recent, 506 is the next previous sample and sample 504 is the oldest of the four samples shown. These samples are also identified by the reference $y_n$ through $y_{n-3}$. Also, a threshold 512 is illustrated, and sample $(y_{n-1}+y_{n-2})/2$ must be greater than the threshold 512 to be considered a pulse during tracking.

Figure 6:
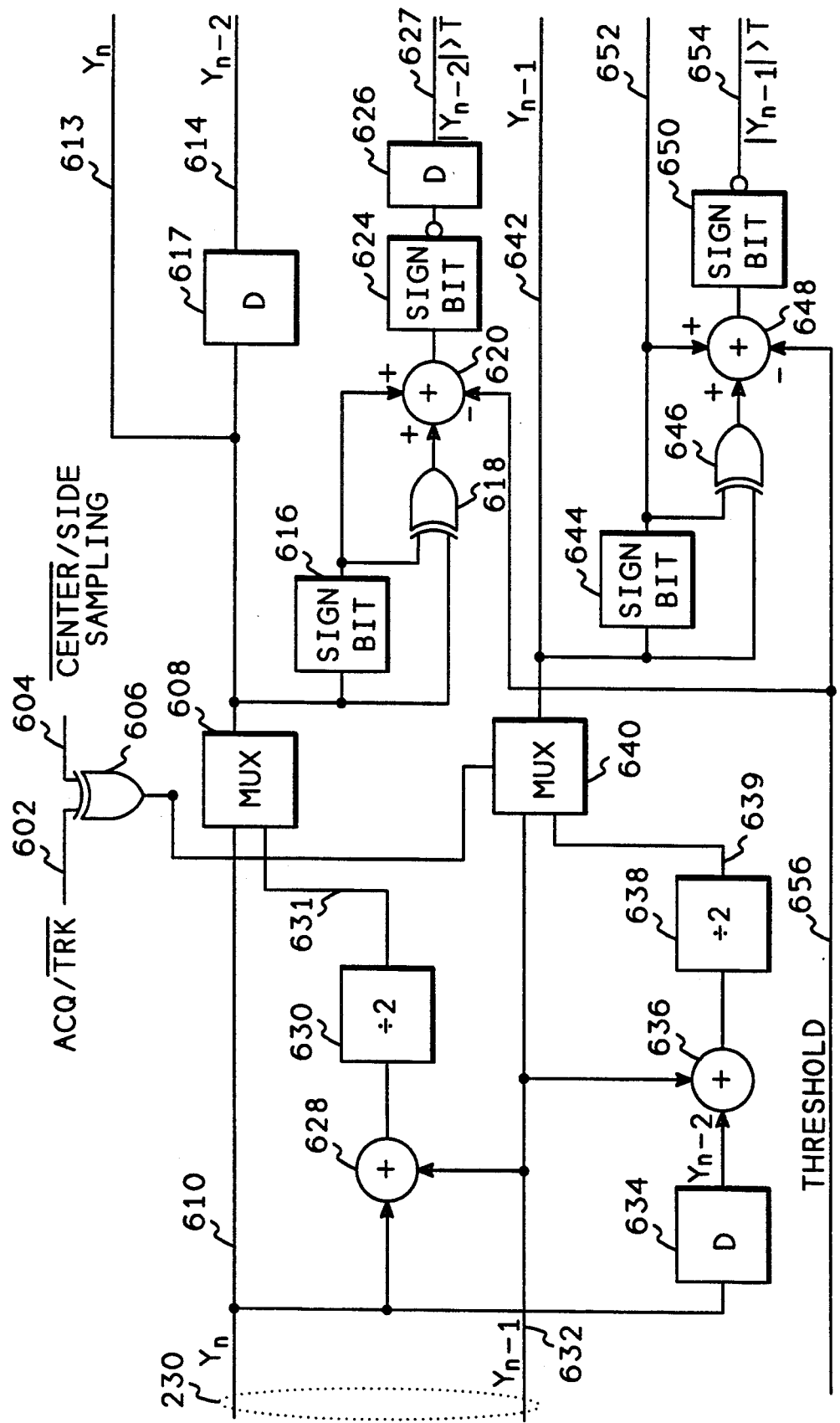
FIGS. 6, 7, and 8 show a high-level logic diagram of the pulse detector of FIG. 3 for the equations of Table 1.
Figure 7:
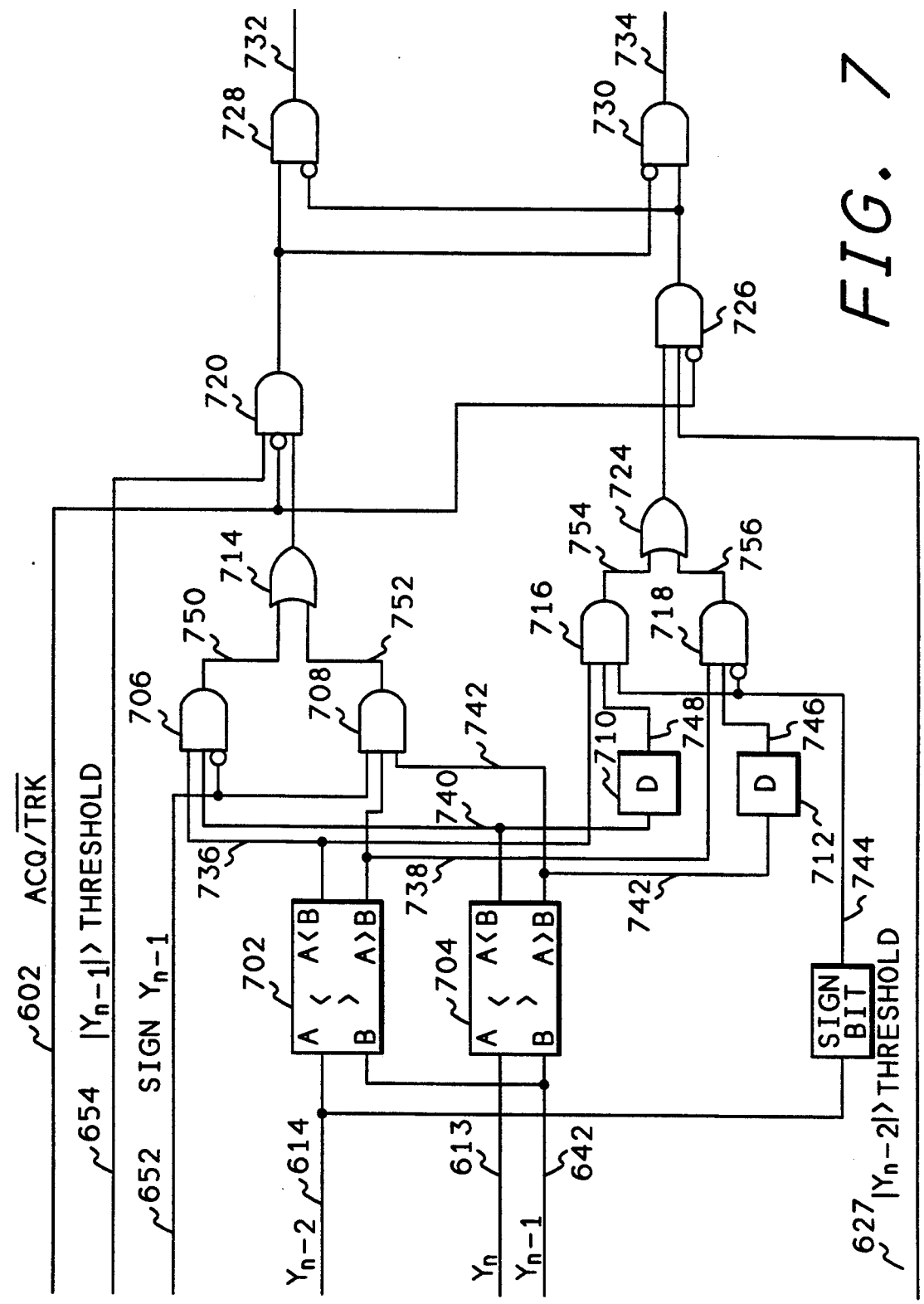
Figure 8:
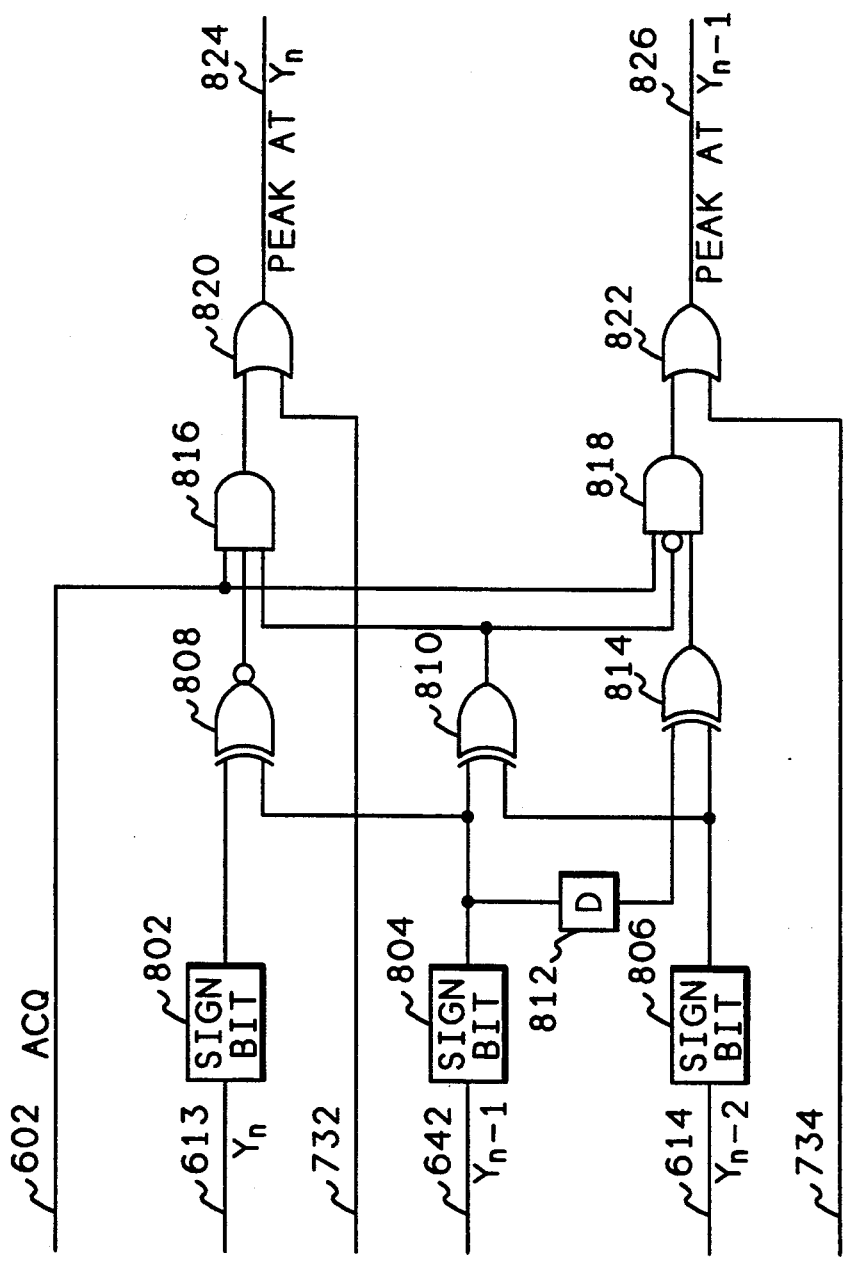

FIGS. 6, 7, and 8 show a high-level logic diagram of the pulse detector 312 of the present invention. Referring now to FIGS. 6, 7, and 8, signals 610 and 632 are received from the register/demultiplexer 207 of FIG. 2 through digital data signal 230. As discussed above with respect to FIG. 2, the analog section 126 sends two samples at a time to the digital section. Signal 610, also designated $y_n$, is the digitized value for the signal level of the most recent sample. Signal 632, also designated $y_{n-1}$, is the digitized value for the signal level of the next prior to the most recent sample. In the preferred embodiment, these two signals are each six bit digital values stored in two's complement number representation, with one of the bits being the sign bit. Signal 610 is fed to a multiplexer 608 and signal 632 is fed to a second multiplexer 640. These multiplexers are controlled by an exclusive-OR gate 606 which has two signals 602 and 604 as its inputs. Signal 602 determines whether the pulse detector is in acquisition or tracking mode, as described above, and signal 604 determines whether the pulse detector is in center or side sampling mode, as discussed above. When the pulse detector is in acquisition and side sampling mode, or the pulse detector is in tracking and center sampling mode, signals 610 and 632 will be selected by the multiplexers 608 and 640 respectively. When the pulse detector is in acquisition mode center sampling or in tracking mode side sampling, the multiplexers 608 and 640 will select signals 631 and 639 respectively.

Signal 631 is called a $(1+D)/2$ signal and is formed by adding signal 610 to signal 632 in summing junction 628 and then dividing this sum by two with a divide by two circuit 630 to produce signal 631. The summing junction 628 is a six bit add circuit and the divide by two circuit 630 is a shift. The signal 631 represents the sum of the $y_n$ signal and $y_{n-1}$ divided by two, therefore, it is the average of $y_n$ and $y_{n-1}$.

Circuits 634, 636, and 638 produce a $(1+D)/2$ signal for the previous samples. That is, delay circuit 634, which is a set of D flip flops, is used to delay the $y_n$ signal 610 by one clock cycle (two sample times), so it becomes signal $y_{n-2}$, which is sent to the summing junction 636. Summing junction 636 sums $y_{n-2}$ with $y_{n-1}$ and divides the result by two to produce the average at signal 639. As disclosed in Table 1, these (1+D)/2 signals are used in two of the four cases that the pulse detector can decode.

After passing through multiplexer 608, $y_n$ signal 610 is sent to FIGS. 7 and 8 over $y_n$ signal 613. This signal is also delayed by delay circuit 617 to become $y_{n-2}$ signal 614. In addition, $y_n$ signal 613 is connected to a sign-bit circuit 616 which extracts only the sign-bit from the six-bit digital value. This sign-bit is connected to an exclusive-OR circuit 618 along with the other bits of the digital value 613. Also, the sign-bit 616 is connected to another summing junction 620 along with the output of the exclusive-OR circuit 618 and a threshold value 656. The circuits 616, 618, and 620 convert the value of $y_n$ to an absolute value, that is, $y_n$ is negated if it was originally a negative value to produce a positive value and is unchanged if it was originally a positive value. The threshold signal 656 is then subtracted from the absolute value to produce a non-negative value if the absolute value of $y_n$ is greater than or equal to the threshold. The summing junction 620 produces a negative value if the absolute value of $y_n$ is less than the threshold 656.

The output of the summing junction 620 is passed to another sign-bit circuit 624 which extracts the sign bit from the result and inverts it. This will indicate whether the absolute value of $y_n$ is greater than or equal to the threshold value 656. The inverted sign-bit is then sent through a delay circuit 626. The output signal 627 of the delay circuit 626 has a value of one if the absolute value of $y_n$ delayed by one clock cycle, that is, $|y_{n-2}|$, is greater than or equal to the threshold value, and is zero if it is less than the threshold.

In a similar manner, $y_{n-1}$ signal 642 is sent to a sign-bit circuit 644, an exclusive-OR circuit 646, and a summing junction 648. The output of the summing junction 648 indicates whether the absolute value of the $y_{n-1}$ signal is greater than or equal to the threshold value 656. This result is passed through a sign-bit circuit 650 and then inverted to indicate whether the absolute value of $y_{n-1}$ is greater than or equal to the threshold value 656.

FIG. 7 shows a high-level logic diagram of the section of the pulse detector 312 that detects pulses during data tracking. Referring now to FIG. 7, comparator circuits 702 and 704 compare the results of the last three samples taken of the signal. $Y_n$ signal 613 is the most recent sample, $y_{n-1}$ signal 642 is the previous sample, and $y_{n-2}$ signal 614 is the sample prior to signal 642. The outputs of the comparator 702 and 704 are connected to a number of AND gates and delay circuits to implement the tracking equations shown in Table 1.

AND gate 706 determines whether a positive pulse is detected at time n (with the peak at time n−1). Output 736 of comparator 702 is a logical one if $y_{n-2}$ is less than $y_{n-1}$, and output 740 of comparator 704 is a logical one if $y_n$ is less than $y_{n-1}$. These signals are ANDed together with the inverted sign of the signal level of $y_{n-1}$ to produce a logical one from AND gate 706 if a positive pulse has been detected at time n.

AND gate 708 determines whether there is a negative pulse at time n (with the peak at time n−1). Output 738 of comparator 702 is a logical one if $y_{n-1}$ is less than $y_{n-2}$, and output 742 of comparator 704 is a logical one if $y_{n-1}$ is less than $y_n$. These signals are ANDed together with the sign of $y_{n-1}$ to produce a logical one from AND gate 708 if a negative pulse is detected at time n.

AND gates 716 and 718 determine whether a pulse is detected at time n−1 (with the peak at time n−2). Output 736 of comparator 702 indicates that $y_{n-2}$ is less than $y_{n-1}$. Output 740 of comparator 704, after being delayed by delay circuit 710, indicates that $y_{n-2}$ is less than $y_{n-3}$. Signal 744 indicates that $y_{n-2}$ is negative, therefore, the ANDing of signals 736, 748, and 744 indicate there is a negative pulse detected at time n−1.

Signal 738 indicates that $y_{n-2}$ is greater than $y_{n-1}$. Signal 746, the output of delay circuit 712, indicates that $y_{n-2}$ is greater than $y_{n-3}$. By ANDing signals 738, 746, and the inverted signal 744, AND gate 718 indicates that a positive pulse is detected at time n−1.

The output of OR gate 714 indicates that a pulse, either positive or negative, is detected at time n, and the output of OR gate 724 indicates that a positive or negative pulse is detected at time n−1. AND gate 720 determines whether the magnitude of the pulse at time n was greater than the threshold value and it also determines whether the pulse detector is in tracking mode. AND gate 726 determines whether the pulse at time n−1 was greater than the threshold and whether the detector is in tracking mode. Because of the recording code used in writing data to the storage media in this application, a pulse can never occur at time n and also at time n−1. Therefore, the outputs of and gates 720 and 726 are cross-coupled to AND gates 728 and 730 to prevent detection of pulses in both locations at once. Thus, the output of gates 728 and 730 will indicate that a pulse occurred either at time n or at time n−1 but not both. These outputs are connected to the circuit of FIG. 8.

FIG. 8 shows a high level logic diagram of the portion of the pulse detector that implements the acquisition equations shown in Table 1 for acquisition mode. Referring now to FIG. 8, signal 602 indicates whether or not the detector is in acquisition mode. Sign-bit extractor circuit 802 and sign-bit extractor circuit 804 extract the sign bits from the values $y_n$ and $y_{n-1}$ respectively. These two sign bits are exclusive NORed in XNOR circuit 808, whose output indicates whether the sign of $y_n$ is equal to the sign of $y_{n-1}$. Circuit 810 indicates whether the sign of $y_{n-1}$ is not equal to the sign of $y_{n-2}$. If both these conditions are true, the output of AND gate 816 will indicate that a pulse is detected at time n (with the peak between time n and time n−1) in acquisition mode. This output is ORed with output 732 from FIG. 7 which indicates whether a pulse is detected at time n in tracking mode, therefore, signal 824 indicates whether a pulse is detected in one of the modes at time n.

The sign-bit output of circuit 804 is delayed one clock cycle to indicate the sign of signal $y_{n-3}$. This signal is exclusive ORed with the sign bit of $y_{n-2}$ by circuit 814, whose output indicates whether the sign of $y_{n-2}$ is not equal to the sign of $y_{n-3}$. The output of exclusive-OR circuit 810, after being inverted at the input of AND gate 818, indicates whether the sign of $y_{n-1}$ is equal to the sign of $y_{n-2}$. Therefore, the output of AND gate 818 indicates whether a pulse is detected in acquisition mode at time n−1 (with the peak between time n−1 and time n−2). This output is ORed with the output 734 of FIG. 7, which indicates whether a pulse is detected in tracking mode at time n−1. Therefore, output 826 indicates whether a pulse is detected at time n−1, either in acquisition or tracking mode.

Figure 9:
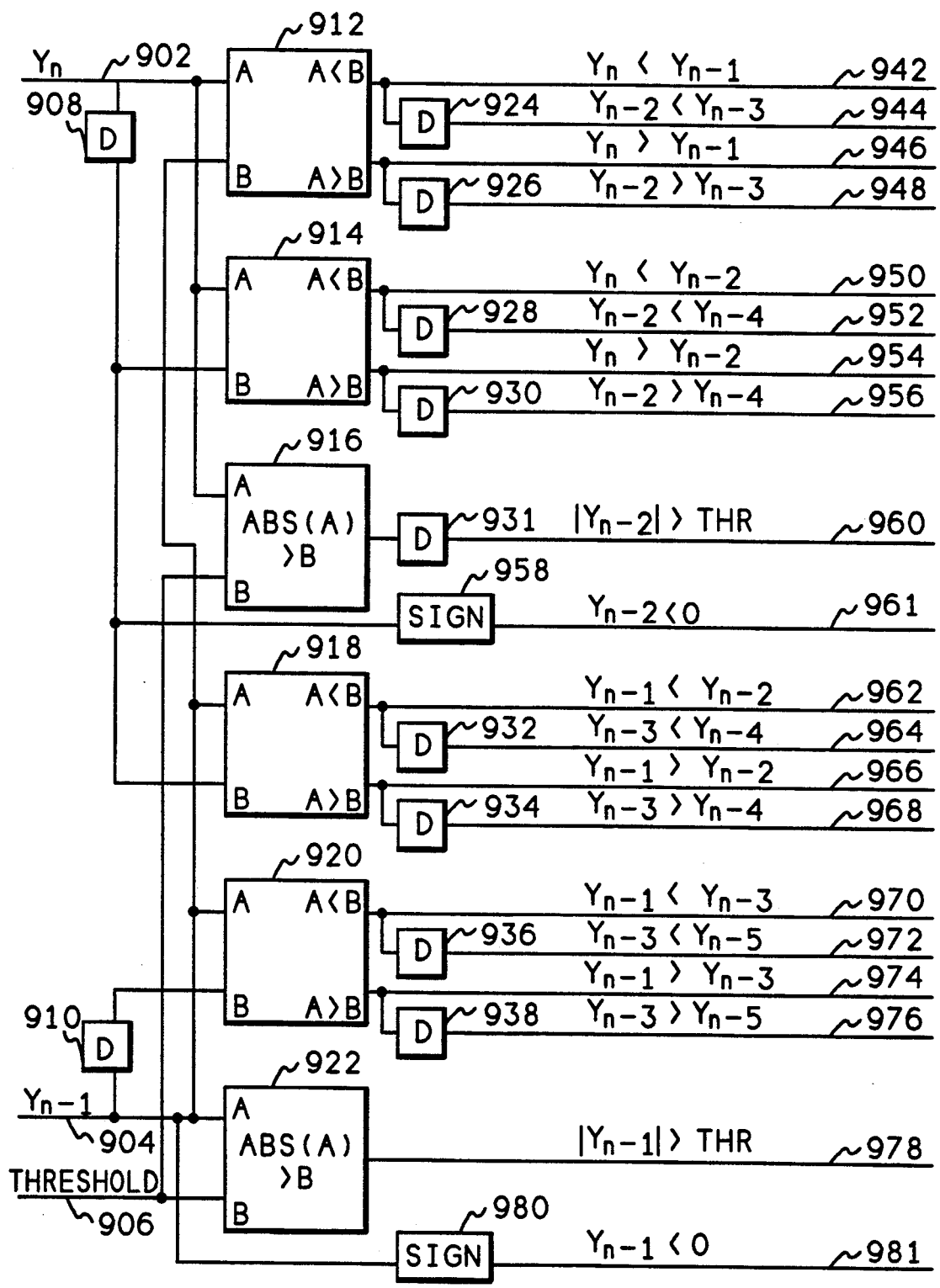
FIGS. 9, 10, and 11 show a high-level logic diagram of the pulse detector of FIG. 3 for the equations of Table 2.
Figure 10:
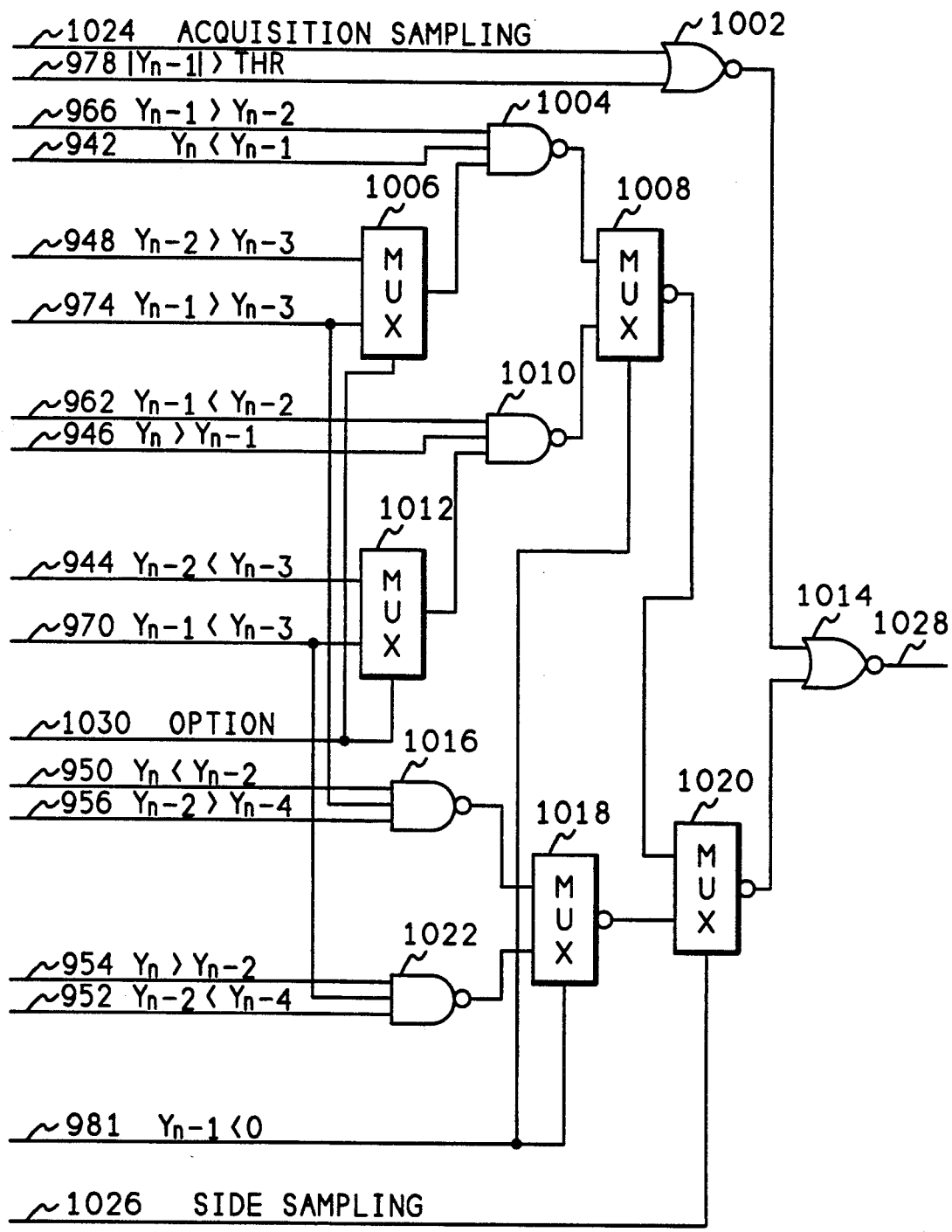
Figure 11:
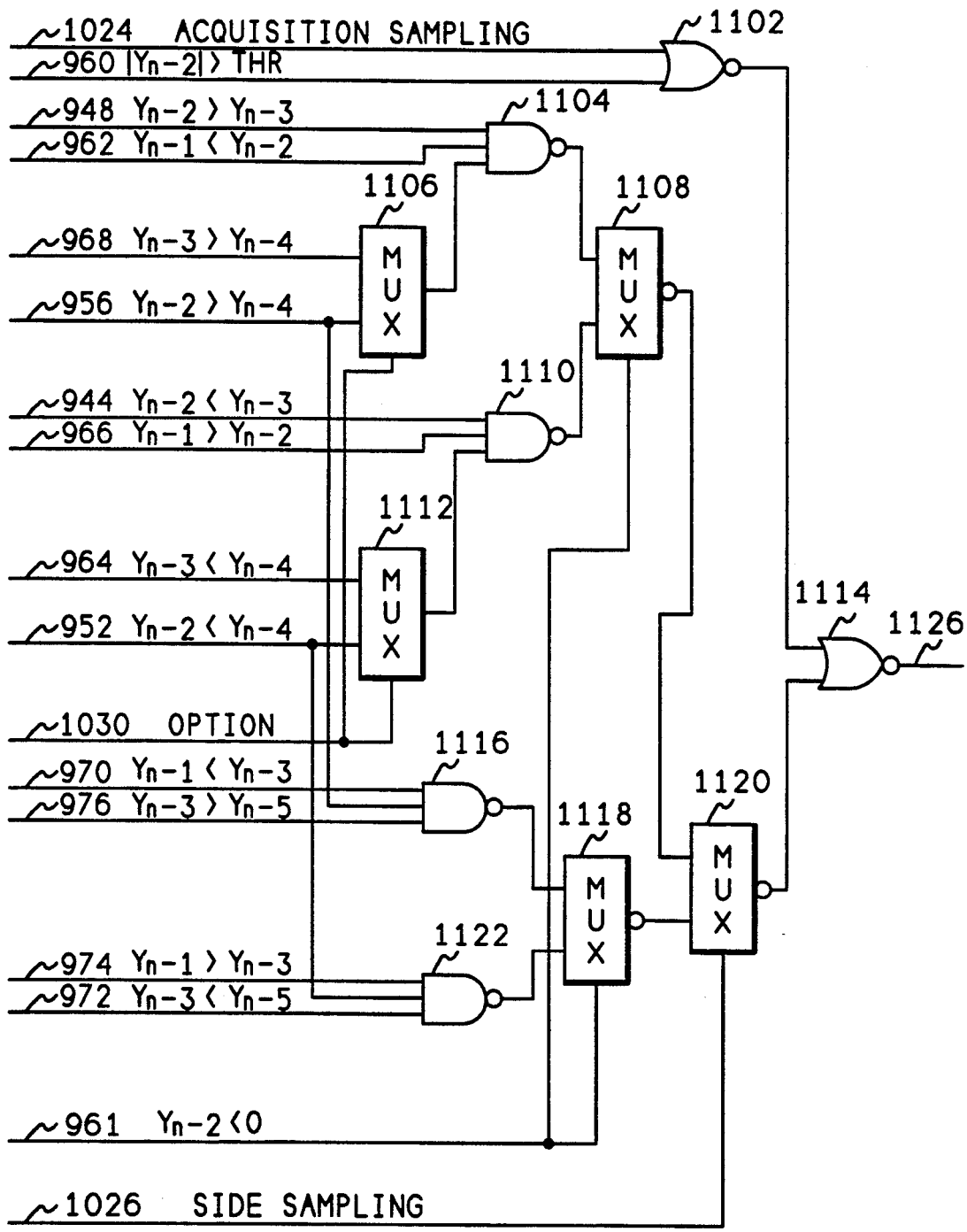

FIGS. 9 through 11 show a circuit that implements the equations of Table 2. This circuit, and the equations of Table 2, provide an implementation of the pulse detector that allows the preamble section of the data to contain different types of patterns. For example, the circuit of FIGS. 6-8 works well for a preamble having a 2 T pattern, which is an alternating 1-0 pattern (10101010...), where a 1 indicates presence of a pulse, a zero indicates absence of a pulse, and pulses alternate in polarity. The circuit of FIGS. 9-11 allows a 2 T pattern, a 3 T pattern (100100...), and an 4 T pattern (10001000...). Thus, the circuit of FIGS. 9-11 and equations of Table 2 are the preferred embodiment and the best mode.

In all cases except side sampling acquisition mode, the equations of both Tables 1 and 2 detect pulses with the same latency. For side sampling acquisition, the equations of Table 1 detect peaks one sample sooner that the equations of Table 2. However, the equations of Table 2 are consistent in the amount of latency in both acquisition and tracking modes, while with the equations of Table 1 for side sampling, the latency in acquisition mode is one sample shorter than the latency in tracking mode.

The equations of Table 2 show detection of a pulse at time $y_n$. As with the circuits of FIGS. 6-8, the circuit of FIGS. 9-11 processes two signal samples simultaneously. The equations for the second sample are the same as the equations of the first sample shown in Table 2, with one time delay. Thus, for example, $y_n$ in Table 2 is replaced by $y_{n-1}$, $y_{n-1}$ is replaced by $y_{n-2}$, etc., for the second sample.

Referring now to FIGS. 9-11, FIG. 9 shows a series of comparators, 912-922, that compare the values of $y_n$, $y_{n-1}$, $y_{n-2}$, and $y_{n-3}$, and compares $y_n$ and $y_{n-1}$ to the threshold value. Most of the comparators have a delay circuit, 924-938, on their output to also provide a comparison of $y_{n-2}$, $y_{n-3}$, $y_{n-4}$, and $y_{n-5}$. These circuits thus provide all the inputs necessary for the equations of Table 2, and the equivalent equations for the second sample as discussed above.

FIG. 10 implements the equations of Table 2 for the current sample, and FIG. 11 implements the equations of Table 2 for the first previous sample. Therefore, in the following description, FIGS. 10 and 11 will be described together.

In FIGS. 10 and 11, NOR circuits 1002 and 1102 determine if the absolute value of the signal is greater than the threshold. As shown in Table 2, this comparison is done in tracking mode, but not in acquisition mode. Multiplexers 1020 and 1120 select side or center sampling mode. Multiplexers 1008 and 1108 select positive or negative pulses in center sampling mode, and multiplexers 1018 and 1118 select positive or negative pulses in side sampling mode. NAND circuits 1004, and 1104 implement the equations for center sampling positive pulses, and NAND circuits 1010 and 1110 implement the equations for center sampling negative pulses. Multiplexers 1006, 1106, 1012, and 1112 allow a user to select one of two equations during center sampling. These equations are shown in Table 2, equation 3, for positive and negative pulses of center sampling. This provides flexibility to the user of the circuit. NAND circuits 1016 and 1116 implement the equations for side sampling, positive pulses, and NAND circuits 1022 and 1122 implement the equations for side sampling, negative pulses. Condition 3 of Table 2 may be omitted during tracking mode when condition 4 is used.

Because data recorded on a magnetic storage medium is recorded using small magnets having alternating north-south poles, the signal detected by the read head will always have alternating positive and negative pulses. Therefore, for detecting signals read from a magnetic recording medium, the equations of Tables 1 and 2 could be easily modified to detect a pulse only if the pulse is opposite in polarity to the previous pulse detected. This could provide additional noise immunity.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

TABLE 1

|  | Acquisition | Tracking |
|---|---|---|
| Side Sampled | 1) $SGN(Y_n) = SGN(Y_{n-1})$<br>2) $SGN(Y_{n-1}) \neq SGN(Y_{n-2})$ | $Y_n$ sequence is filtered by $(1 + D)/2$, then fed into Center Sampled tracking pulse detector |
| Center Sampled | $Y_n$ sequence is filtered by $(1 + D)/2$, then fed into Side Sampled acquisition pulse detector | Pos Pulse<br>1) $Y_{n-1} >$ Thr<br>2) $Y_{n-1} > Y_{n-2}$<br>3) $Y_{n-1} > Y_n$ | Neg Pulse<br>1) $Y_{n-1} < -$Thr<br>2) $Y_{n-1} < Y_{n-2}$<br>3) $Y_{n-1} < Y_n$ | where Thr is the Threshold value

TABLE 2

|  | Positive Pulse | Negative Pulse |
|---|---|---|
| Side Sampled | 1) $Y_n < Y_{n-2}$<br>2) $Y_{n-3} < Y_{n-1}$<br>3) $Y_{n-4} < Y_{n-2}$ | 1) $Y_n > Y_{n-2}$<br>2) $Y_{n-3} > Y_{n-1}$<br>3) $Y_{n-4} > Y_{n-2}$ |
| Trk Only | 4) $Y_{n-1} >$ Thr | 4) $-Y_{n-1} >$ Thr |
| Center Sampled | 1) $Y_n < Y_{n-1}$<br>2) $Y_{n-2} < Y_{n-1}$<br>3) $Y_{n-3} < Y_{n-2}$<br>or<br>$Y_{n-3} < Y_{n-1}$ | 1) $Y_n > Y_{n-1}$<br>2) $Y_{n-2} > Y_{n-1}$<br>3) $Y_{n-3} > Y_{n-2}$<br>or<br>$Y_{n-3} > Y_{n-1}$ |
| Trk Only | 4) $Y_{n-1} >$ Thr | 4) $-Y_{n-1} >$ Thr | where Thr is the Threshold value

What is claimed is:

1. A circuit for detecting pulses in a continuous signal, said circuit comprising:

an analog to digital converter for converting said signal to digital sample values at controlled sampling times;

at least one first data storage register connected to an output of said analog to digital converter for storing at least one previous digital sample value as said digital sample value is created at said controlled sampling times;

at least one comparator connected to said at least one first data storage register, and connected to said output of said analog to digital converter, for comparing a previous digital sample value and a current digital sample value from said analog to digital converter;

at least one second data storage register connected to an output of each of said at least one comparator for storing a result of said comparing;

first logic circuit means connected to an output of said at least one comparator, an output of said at least one first data storage register, and an output of said at least one second data storage register for indicating a pulse at a first previous sample time if a value of a second previous sample is lower than a value of a first previous sample, a value of a third previous sample is lower than said value of said second previous sample, a value of said output of said analog to digital converter is lower than said value of said first previous sample and said value of said first previous sample is nonnegative; and second logic circuit means connected to an output of said at least one comparator, an output of said at least one first data storage register, and an output of said at least one second data storage register for indicating a pulse at said first previous sample time if a value of said second previous sample is greater than a value of said first previous sample, a value of said third previous sample is greater than said value of said second previous sample, a value of said output of said analog to digital converter is greater than said value of said first previous sample and said value of said first previous sample is negative.

2. A circuit for detecting pulses in a continuous signal, said circuit comprising:

an analog to digital converter for converting said signal to digital sample values at controlled sampling times;

at least one first data storage register connected to an output of said analog to digital converter for storing at least one previous digital sample value as said digital sample value is created at said controlled sampling times;

at least one comparator connected to said at least one first data storage register, and connected to said output of said analog to digital converter, for comparing a previous digital sample value and a current digital sample value from said analog to digital converter;

at least one second data storage register connected to an output of each of said at least one comparator for storing a result of said comparing;

first logic circuit means connected to an output of said at least one comparator, an output of said at least one first data storage register, and an output of said at least one second data storage register for indicating a pulse at a first previous sample time if a value of a second previous sample is lower than a value of a first previous sample, a value of a third previous sample is lower than said value of said second previous sample, a value of said output of said analog to digital converter is lower than said value of said first previous sample and said value of said first previous sample is nonnegative; and second logic circuit means connected to an output of said at least one comparator, an output of said at least one first data storage register, and an output of said at least one second data storage register for indicating a pulse at said first previous sample time if a value of said second previous sample is greater than a value of said first previous sample, a value of said third previous sample is greater than said value of said second previous sample, a value of said output of said analog to digital converter is greater than said value of said first previous sample and said value of said first previous sample is negative.

3. The circuit of claims 1 or 2 wherein said first and second logic circuit means further comprise:

a first threshold comparator contained within said first logic means for comparing said value of said first previous sample to a predetermined threshold value and allowing said indication of a pulse at said first previous sample time if said value of said first previous sample is greater than said predetermined threshold value; and a second threshold comparator contained within said second logic means for comparing said value of said first previous sample to said predetermined threshold value and allowing said indication of a pulse at said first previous sample time if said value of said first previous sample is greater than a negative of said predetermined threshold value.

4. The circuit of claims 1 or 2 further comprising:

a third logic circuit means connected to an output of said at least one comparator, an output of said at least one first data storage register, and an output of said at least one second data storage register for indicating a pulse at a second previous sample time if a value of said third previous sample is lower than a value of said second previous sample, a value of a fourth previous sample is lower than said value of said third previous sample, a value of said first previous sample is lower than said value of said second previous sample and said value of said second previous sample is nonnegative; and a fourth logic circuit means connected to an output of said at least one comparator, an output of said at least one first data storage register, and an output of said at least one second data storage register for indicating a pulse at a second previous sample time if a value of said third previous sample is greater than a value of said second previous sample, a value of said fourth previous sample is greater than said value of said third previous sample, a value of said first previous sample is greater than said value of said second previous sample and said value of said second previous sample is negative.

5. The circuit of claim 4 wherein said first through fourth logic circuit means further comprise:

a first threshold comparator contained within said first logic means for comparing said value of said first previous sample to a predetermined threshold value and allowing said indication of a pulse at said first previous sample time if said value of said first previous sample is greater than said predetermined threshold value;

a second threshold comparator contained within said second logic means for comparing said value of said first previous sample to said predetermined threshold value and allowing said indication of a pulse at said first previous sample time if said value of said first previous sample is less than a negative of said predetermined threshold value;

a third threshold comparator contained within said third logic means for comparing said value of said second previous sample to said predetermined threshold value and allowing said indication of a pulse at said second previous sample time if said value of said first previous sample is greater than said predetermined threshold value; and a fourth threshold comparator contained within said fourth logic means for comparing said value of said second previous sample to said predetermined threshold value and allowing said indication of a pulse at said second previous sample time if said value of said first previous sample is less than a negative of said predetermined threshold value.

6. The circuit of claims 1 or 2 further comprising:

a third logic circuit means connected to an output of said at least one comparator, an output of said at least one first data storage register, and an output of said at least one second data storage register for indicating a pulse at a second previous sample time if a value of said third previous sample is lower than a value of said second previous sample, a value of a fourth previous sample is lower than said value of said second previous sample, a value of said first previous sample is lower than said value of said second previous sample and said value of said second previous sample is nonnegative; and a fourth logic circuit means connected to an output of said at least one comparator, an output of said at least one first data storage register, and an output of said at least one second data storage register for indicating a pulse at a second previous sample time if a value of said third previous sample is greater than a value of said second previous sample, a value of said fourth previous sample is greater than said value of said third previous sample, a value of said first previous sample is greater than said value of said second previous sample and said value of said second previous sample is negative.

7. The circuit of claim 6 wherein said first through fourth logic circuit means further comprise:

a first threshold comparator contained within said first logic means for comparing said value of said first previous sample to a predetermined threshold value and allowing said indication of a pulse at said first previous sample time if said value of said first previous sample is greater than said predetermined threshold value;

a second threshold comparator contained within said second logic means for comparing said value of said first previous sample to said predetermined threshold value and allowing said indication of a pulse at said first previous sample time if said value of said first previous sample is less than a negative of said predetermined threshold value;

a third threshold comparator contained within said third logic means for comparing said value of said second previous sample to said predetermined threshold value and allowing said indication of a pulse at said second previous sample time if said value of said first previous sample is greater than said predetermined threshold value; and a fourth threshold comparator contained within said fourth logic means for comparing said value of said second previous sample to said predetermined threshold value and allowing said indication of a pulse at said second previous sample time if said value of said first previous sample is less than a negative of said predetermined threshold value.

8. A circuit for detecting pulses in a continuous signal, said circuit comprising:

an analog to digital converter for converting said signal to digital sample values at controlled sampling times;

at least one first data storage register connected to an output of said analog to digital converter for storing at least one previous digital sample value as said digital sample value is created at said controlled sampling times;

at least one comparator connected to said at least one first data storage register, and connected to said output of said analog to digital converter, for comparing a previous digital sample value and a current digital sample value from said analog to digital converter;

at least one second data storage register connected to an output of each of said at least one comparator for storing a result of said comparing;

first logic circuit means connected to an output of said at least one comparator, an output of said at least one first data storage register, and an output of said at least one second data storage register for indicating a pulse at a first previous sample time if a value of a second previous sample is lower than a value of a first previous sample, a value of said first previous sample is greater than a predetermined threshold value, a value of said output of said analog to digital converter is lower than said value of said first previous sample and said value of said first previous sample is nonnegative; and second logic circuit means connected to an output of said at least one comparator, an output of said at least one first data storage register and an output of said at least one second data storage register for indicating a pulse at said first previous sample time if a value of said second previous sample is greater than a value of said first previous sample, a value of said first previous sample is less than a negative of said predetermined threshold value, a value of said output of said analog to digital converter is greater than said value of said first previous sample and said value of said first previous sample is negative.

9. A circuit for detecting pulses in a continuous signal, said circuit comprising:

an analog to digital converter for converting said signal to digital sample values at controlled sampling times;

at least one first data storage register connected to an output of said analog to digital converter for storing at least one previous digital sample value as said digital sample value is created at said controlled sampling times;

at least one comparator connected to said at least one first data storage register, and connected to said output of said analog to digital converter, for comparing a previous digital sample value and a current digital sample value from said analog to digital converter;

at least one second data storage register connected to an output of each of said at least one comparator for storing a result of said comparing;

first logic circuit means connected to an output of said at least one comparator, an output of said at least one first data storage register, and an output of said at least one second data storage register for indicating a pulse at a first previous sample time if a value of a second previous sample is lower than a value of a first previous sample, a value of said first previous sample is greater than a predetermined threshold value, a value of said output of said analog to digital converter is lower than said value of said first previous sample and said value of said first previous sample is nonnegative; and second logic circuit means connected to an output of said at least one comparator, an output of said at least one first data storage register, and an output of said at least one second data storage register for indicating a pulse at said first previous sample time if a value of said second previous sample is greater than a value of said first previous sample, a value of said first previous sample is less than a negative of said predetermined threshold value, a value of said output of said analog to digital converter is greater than said value of said first previous sample and said value of said first previous sample is negative;

a third logic circuit means connected to an output of said at least one comparator, an output of said at least one first data storage register, and an output of said at least one second data storage register for indicating a pulse at a second previous sample time if a value of a third previous sample is lower than a value of said second previous sample, a value of said second previous sample is greater than said predetermined threshold value, a value of said first previous sample is lower than said value of said second previous sample and said value of said second previous sample is nonnegative; and a fourth logic circuit means connected to an output of said at least one comparator, an output of said at least one first data storage register, and an output of said at least one second data storage register for indicating a pulse at said second previous sample time if a value of said third previous sample is greater than a value of said second previous sample, a value of said second previous sample is greater than said predetermined threshold value, a value of said first previous sample is greater than said value of said second previous sample and said value of said second previous sample is negative.

10. A circuit for detecting pulses in a continuous signal, said circuit comprising:

an analog to digital converter for converting said signal to digital sample values at controlled sampling times;

at least one first data storage register connected to an output of said analog to digital converter for storing at least one previous digital sample value as said digital sample value is created at said controlled sampling times;

at least one comparator connected to said first data storage register, and connected to said output of said analog to digital converter, for comparing a previous digital sample value and a current digital sample value from said analog to digital converter;

at least one second data storage register connected to an output of each of said at least one comparator for storing a result of said comparing;

first logic circuit means connected to an output of said at least one comparator, an output of said at least one first data storage register, and an output of said at least one second data storage register for indicating a pulse at a first previous sample time if a value of a third previous sample is lower than a value of a first previous sample, a value of a fourth previous sample is lower than a value of a second previous sample, a value of the output of said analog to digital converter is lower than said value of said second previous sample and said value of said first previous sample is nonnegative; and second logic circuit means connected to an output of said at least one comparator, an output of said at least one first data storage register, and an output of said at least one second data storage register for indicating a pulse at said first previous sample time if a value of said third previous sample is greater than a value of said first previous sample, a value of said fourth previous sample is greater than a value of said second previous sample, a value of said output of said analog to digital converter is greater than said value of said second previous sample and said value of said first previous sample is negative.

11. The circuit of claim 10 wherein said first and second logic circuit means further comprise:

a first threshold comparator contained within said first logic means for comparing said value of said first previous sample to a predetermined threshold value and allowing said indication of a pulse at said first previous sample time if said value of said first previous sample is greater than said predetermined threshold value; and a second threshold comparator contained within said second logic means for comparing said value of said first previous sample to said predetermined threshold value and allowing said indication of a pulse at said first previous sample time if said value of said first previous sample is less than a negative of said predetermined threshold value.

12. The circuit of claim 10 further comprising:

a third logic circuit means connected to an output of said at least one comparator, an output of said at least one first data storage register, and an output of said at least one second data storage register for indicating a pulse at a second previous sample time if a value of said fourth previous sample is lower than a value of said second previous sample, a value of a fifth previous sample is lower than said value of said third previous sample, a value of said first previous sample is lower than said value of said third previous sample and said value of said second previous sample is nonnegative; and a fourth logic circuit means connected to an output of said at least one comparator, an output of said at least one first data storage register, and an output of said at least one second data storage register for indicating a pulse at a second previous sample time if a value of said fourth previous sample is greater than a value of said second previous sample, a value of said fifth previous sample is greater than said value of said third previous sample, a value of said first previous sample is greater than said value of said third previous sample and said value of said second previous sample is negative.

13. The circuit of claim 12 wherein said first through fourth logic circuit means further comprise:
- a first threshold comparator contained within said first logic means for comparing said value of said first previous sample to a predetermined threshold value and allowing said indication of a pulse at said first previous sample time if said value of said first previous sample is greater than said predetermined threshold value;
- a second threshold comparator contained within said second logic means for comparing said value of said first previous sample to said predetermined threshold value and allowing said indication of a pulse at said first previous sample time if said value of said first previous sample is less than a negative of said predetermined threshold value;
- a third threshold comparator contained within said third logic means for comparing said value of said second previous sample to said predetermined threshold value and allowing said indication of a pulse at said second previous sample time if said value of said first previous sample is greater than said predetermined threshold value; and
- a fourth threshold comparator contained within said fourth logic means for comparing said value of said second previous sample to said predetermined threshold value and allowing said indication of a pulse at said second previous sample time if said value of said first previous sample is less than a negative of said predetermined threshold value.

14. A circuit for detecting pulses in a continuous signal, said circuit comprising:
- an analog to digital converter for converting said signal to digital sample values at controlled sampling times;
- at least one data storage register connected to an output of said analog to digital converter for storing a previous digital sample value as said digital sample value is created at said controlled sampling time;
- at least one threshold comparator connected to said at least one data storage register for comparing said stored digital sample value to a predetermined threshold value;
- at least one comparator connected to said at least one data storage register, and connected to an output of said threshold comparator and further connected to said output of said analog to digital converter, for comparing said stored digital sample values and a current digital sample value from said analog to digital converter and for indicating a pulse at a most recently stored digital sample value if a next most recently stored digital sample value is a lower value than said most recently stored digital sample value and said current digital sample value is a lower value than said most recently stored digital sample value and said most recently stored digital sample value is a greater value than said predetermined threshold value; and
- at least one comparator connected to said at least one data storage register, and connected to an output of said threshold comparator and further connected to said output of said analog to digital converter, for comparing said stored digital sample values and a current digital sample value from said analog to digital converter and for indicating a pulse at a most recently stored digital sample value if a next most recently stored digital sample value is a higher value than said most recently stored digital sample value and said current digital sample value is a higher value than said most recently stored digital sample value and said most recently stored digital sample value is a lower value than the negative of said predetermined threshold value.

15. The circuit of claim 14 further comprising:
- averaging means connected between said analog to digital converter and said at least one data storage register for averaging an output of said analog to digital converter with a most recent past output of said analog to digital converter to produce an average value for storing in said at least one data storage register.

16. A circuit for detecting pulses in a continuous signal, said circuit comprising:
- an analog to digital converter for converting said signal to digital sample values at controlled sampling times;
- at least one data storage register connected to an output of said analog to digital converter for storing a previous digital sample value as said digital sample value is created at said controlled sampling time; and
- at least one comparator connected to said at least one data storage register and connected to an output of said analog to digital converter for comparing a sign bit of each of said stored digital sample values and a sign bit of a current digital sample value from said analog to digital converter and for indicating a pulse at a most recently stored digital sample value if a sign bit of a next most recently stored digital sample value is not equal to a sign bit of said most recently stored digital sample value and a sign bit of said current digital sample value is equal to a sign bit of said most recently stored digital sample value.

17. The circuit of claim 16 further comprising:
- averaging means connected between said analog to digital converter and said at least one data storage register for averaging an output of said analog to digital converter with a most recent past output of said analog to digital converter to produce an average value for storing in said at least one data storage register.

18. A circuit for detecting pulses in a continuous signal, said circuit comprising:
- an analog to digital converter for converting said signal to digital sample values at controlled sampling times;
- a first data storage register connected to an output of said analog to digital converter and connected in such a manner as to store every other sample;
- a second data storage register connected to an output of said analog to digital converter and connected in such a manner as to store every other sample, wherein said second data register stores samples not stored by said first data storage register;
- a first threshold comparator connected to said output of said analog to digital converter for comparing an absolute value of said output of said analog to digital converter to a predetermined threshold value;
- a third data storage register connected to an output of said first threshold comparator for storing a result of said comparison;
- a second threshold comparator connected to said first data storage register for comparing an absolute value of an output of said first data storage register to said predetermined threshold value;

a pair of comparators connected to said first and second data storage registers and connected to said output of said analog to digital converter for comparing said stored digital sample values and a current digital sample value from said analog to digital converter; and a first logic circuit connected to outputs of said pair of comparators and connected to an output of said second threshold comparator, wherein said first logic circuit indicates a pulse at a most recently stored digital sample value if a next most recently stored digital sample value is less than said most recently stored digital sample value and said current digital sample value is less than said most recently stored digital sample value and said second threshold comparator indicates that an absolute value of said most recently stored digital sample value is greater than said predetermined threshold value and said next most recently stored digital sample value is nonnegative;

a second logic circuit connected to outputs of said pair of comparators and connected to an output of said second threshold comparator, wherein said first logic circuit indicates a pulse at a most recently stored digital sample value if a next most recently stored digital sample value is greater than said most recently stored digital sample value and said current digital sample value is greater than said most recently stored digital sample value and said second threshold comparator indicates that an absolute value of said most recently stored digital sample value is greater than said predetermined threshold value and said next most recently stored digital sample value is negative;

a third logic circuit connected to outputs of said pair of comparators and connected to an output of said third data storage register, wherein said second logic circuit indicates a pulse at said next most recently stored digital sample value if a second next most recently stored digital sample value is less than said next most recently stored digital sample and said most recently stored digital sample value is less than said next most recently stored digital sample value and said third data storage register indicates that an absolute value of said next most recently stored digital sample value is greater than said predetermined threshold value and said next most recently stored digital sample value is nonnegative; and a fourth logic circuit connected to outputs of said pair of comparators and connected to an output of said third data storage register, wherein said second logic circuit indicates a pulse at said next most recently stored digital sample value if a second next most recently stored digital sample value is greater than said next most recently stored digital sample and said most recently stored digital sample value is greater than said next most recently stored digital sample value and said third data storage register indicates that an absolute value of said next most recently stored digital sample value is greater than said predetermined threshold value and said next most recently stored digital sample value is negative.

19. The circuit of claim 18 further comprising:
averaging means connected between said analog to digital converter and said first and second data storage registers for averaging an output of said analog to digital converter with a most recent past output of said analog to digital converter to produce an average value for storing in said first and second data storage registers.

20. A circuit for detecting pulses in a continuous signal, said circuit comprising:
an analog to digital converter for converting said signal to digital sample values at controlled sampling times;

a first data storage register connected to an output of said analog to digital converter and connected to store every other sample;

a second data storage register connected to an output of said analog to digital converter and connected to store every other sample, wherein said second data register stores samples not stored by said first data storage register;

a first logic circuit connected to an output of said first data storage register and connected to an output of said analog to digital converter, wherein said first logic circuit indicates a pulse at a most recently stored digital sample value if a sign of a next most recently stored digital sample value is not equal to a sign of said most recently stored digital sample value and a sign of an output of said analog to digital converter is equal to said sign of said most recently stored digital sample value;

a second logic circuit connected to outputs of said first and second data storage register, wherein said second logic circuit indicates a pulse at said next most recently stored digital sample value if a sign of a second next most recently stored digital sample value is not equal to said sign of said next most recently stored digital sample value and said sign of said most recently stored digital sample value is equal to said sign of said next most recently stored digital sample value.

21. The circuit of claim 20 further comprising:
averaging means connected between said analog to digital converter and said first and second data storage registers for averaging an output of said analog to digital converter with a most recent past output of said analog to digital converter to produce an average value for storing in said first and second data storage registers.

* * * * *

UNITED STATES PATENT AND TRADEMARK OFFICE
CERTIFICATE OF CORRECTION

PATENT NO. : 5,329,554
DATED : July 12, 1994
INVENTOR(S) : Richard T. Behrens, et. al.

It is certified that error appears in the above-identified patent and that said Letters Patent is hereby corrected as shown below:

In Claim 2, column 12, line 1, please change "second" to --first--.

In Claim 2, column 12, line 13, please change "second" to --first--.

In Claim 3, column 12, line 31, please change "greater" to --less--.

In Claim 6, column 13, line 42, please change "third" to --second--.

In Claim 9, column 15, please change "greater" to --less-- and change "value, a" to --value, and a --.

Signed and Sealed this

Seventh Day of April, 1998

Attest:

BRUCE LEHMAN

*Attesting Officer*    Commissioner of Patents and Trademarks